United States Patent
Cohen et al.

(10) Patent No.: US 11,915,751 B2
(45) Date of Patent: Feb. 27, 2024

(54) NONVOLATILE PHASE CHANGE MATERIAL LOGIC DEVICE

(71) Applicant: International Business Machines Corporation, Armonk, NY (US)

(72) Inventors: Guy M. Cohen, Westchester, NY (US); Nanbo Gong, White Plains, NY (US); Takashi Ando, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 17/472,836

(22) Filed: Sep. 13, 2021

(65) Prior Publication Data

US 2023/0083308 A1   Mar. 16, 2023

(51) Int. Cl.
*G11C 11/00*   (2006.01)
*G11C 13/00*   (2006.01)
(Continued)

(52) U.S. Cl.
CPC ...... *G11C 13/0069* (2013.01); *G11C 13/0004* (2013.01); *H10B 63/84* (2023.02);
(Continued)

(58) Field of Classification Search
CPC ............ G11C 13/0069; G11C 13/0004; G11C 13/008
(Continued)

(56) References Cited

U.S. PATENT DOCUMENTS 7,126,847 B2   10/2006   Ha
8,071,968 B2   12/2011   Chang
(Continued)

FOREIGN PATENT DOCUMENTS

| CN | 112086117 A | 12/2020 |
| WO | 2015096244 A1 | 7/2015 |
| WO | 2023036604 A1 | 3/2023 |

OTHER PUBLICATIONS

Karpov et al., "Set to Reset programming in phase change memories", IEEE Electron Device Letters, vol. 27, No. 10, Oct. 2006, 4 Pages.
(Continued)

*Primary Examiner* — Vu A Le
(74) *Attorney, Agent, or Firm* — David K. Mattheis (57) ABSTRACT

A method for forming a nonvolatile PCM logic device may include providing a PCM film component having a first end contact distally opposed from a second end contact, positing a first proximity adjacent to a first surface of the PCM film component, positing a second proximity heater adjacent to a second surface of the PCM film component, wherein the first proximity heater and the second proximity heater are electrically isolated from the PCM film component. The method may further include applying a combination of pulses to one or more of the first proximity heater and the second proximity heater to change a resistance value of the PCM film component corresponding to a logic truth table. Further, the method may include simultaneously applying a first combination of reset pulses to program, or set pulses to initialize, the PCM film component, to the first proximity heater and the second proximity heater.

20 Claims, 8 Drawing Sheets

(51) Int. Cl.
*H10N 70/00* (2023.01)
*H10B 63/00* (2023.01)

(52) U.S. Cl.
CPC ....... *H10N 70/801* (2023.02); *H10N 70/8828* (2023.02); *G11C 2013/008* (2013.01)

(58) Field of Classification Search
USPC ........................................................ 365/148
See application file for complete search history.

(56) References Cited

U.S. PATENT DOCUMENTS

| | | | |
|---|---|---|---|
| 9,257,647 B2 | 2/2016 | Borodulin | |
| 9,543,955 B2 | 1/2017 | Miao | |
| 10,115,460 B2 | 10/2018 | Torti | |
| 2007/0155093 A1* | 7/2007 | Jeong | G11C 13/0004 438/257 |
| 2007/0235784 A1* | 10/2007 | Krusin-Elbaum | H10N 70/8613 257/296 |
| 2008/0205128 A1 | 8/2008 | Nakai | |
| 2010/0133503 A1* | 6/2010 | Kuo | H10N 70/8413 365/163 |
| 2013/0306929 A1 | 11/2013 | Lee | |

OTHER PUBLICATIONS

Wang et al., "A Low-Loss Directly Heated Two-Port RF Phase Change Switch", IEEE Electron Device Letters, Jan. 26, 2014, 3 Pages.

Hu et al., "Stacked GeTe Multi-level Phase-change Memory with Asymmetric Double-Heater", 2 pps., Jun. 18, 2014.

International Search Report and Written Opinion dated Nov. 23, 2022 from International Application No. PCT/EP2022/073437.

Wang et al., "Phase-change activities on gallium-doped indium oxide", Journal of Applied Physics 108, 084503 (2010), 6 pps., published online Oct. 19, 2010, © 2010 American Institute of Physics.

* cited by examiner

NONVOLATILE PHASE CHANGE MATERIAL LOGIC DEVICE

BACKGROUND

The present application relates to a nonvolatile logic device. More particularly, the present application relates to a nonvolatile phase change material (PCM) logic device.

PCM based resistive memory devices or Resistive Processing Units (RPUs) are based on PCM devices that are typically implemented using two terminal devices. The PCM device design may include two contacts (e.g., a top electrode and a bottom electrode) including a PCM inserted in between. The PCM device is electrically switched between two resistance states namely the amorphous state (i.e., high resistance) and the crystalline state (i.e., low resistance). When a reset pulse is applied, current flows through the PCM, causing the PCM to melt-quench and forming an amorphous region adjacent to one of the two contacts (e.g., bottom electrode). When a set pulse is applied to the PCM, the amorphous region crystallizes.

The RPU element may be implemented using phase change material in the form of a resistor since these materials' resistance can be tuned and they further maintain the resistance to which they were tuned (memory function) without being connected to a power source (nonvolatile memory function). PCM devices with a proximity resistive heater were used to implement Radio Frequency (RF) switches. These devices typically consist of a PCM strip which is contacted at both opposing ends of the PCM strip. A resistive heater is typically located under the center of the PCM strip and is electrically isolated from the PCM material but is thermally coupled to the PCM material. When a reset pulse is applied to the resistive heater, the PCM material above the resistive heater undergoes a melt-quench, forming an amorphous region of high resistance that effectively "disconnects" the two contacts. A set pulse will re-crystallize the PCM material above the resistive heater, forming a low resistance region which connects the two contacts.

SUMMARY

A nonvolatile phase change material (PCM) logic device and a method for forming the same is described.

In an embodiment, a method for forming a nonvolatile PCM logic device may include providing a PCM film component having a first end contact distally opposed from a second end contact. The method may further include positing a first proximity heater adjacent to a first surface of the PCM film component and positing a second proximity heater adjacent to a second surface of the PCM film component, where the first proximity heater and the second proximity heater may be electrically isolated from the PCM film component.

In an embodiment, the method may further include applying a combination of pulses to one or more of the first proximity heater and the second proximity heater to change a resistance value of the PCM film component corresponding to a logic truth table.

In an embodiment, the nonvolatile PCM logic device may include a PCM film component having a first end contact distally opposed from a second end contact. Further, the nonvolatile PCM logic device may include a first proximity heater posited between a first surface of the PCM film component and a second proximity heater posited between a second surface of the PCM film component.

In an embodiment, a nonvolatile modular PCM logic device may include a multi-facet PCM bar component having a plurality of sides and a first end contact distally opposed from a second end contact; a plurality of proximity heaters each partially covering one of the plurality of sides of the multi-facet PCM bar component, wherein applying a combination of pulses to one or more of the plurality of proximity heaters changes a resistance value of the multi-facet PCM bar component corresponding to a logic truth table.

DETAILED DESCRIPTION

Embodiments of the present invention recognize that a nonvolatile logic gate would provide benefits to logic gates that are volatile (e.g., unstable logic states). With a nonvolatile logic gate, the logic gate output remains valid even after the inputs to the device are removed. Hence, the nonvolatile logic gate is especially useful to configure circuit wiring which can be operated in various configurations. Thus, implementing methods or devices for this nonvolatile logic gate provides for either a NAND or NOR gate, where the output remains valid even after the inputs are removed, or the circuit is powered off.

In an embodiment, a method may include initializing the PCM film component by simultaneously applying a first combination of set pulses to the first proximity heater and to the second proximity heater.

In an embodiment, the method may include programming the PCM film component by simultaneously applying a first combination of reset pulses to the first proximity heater and to the second proximity heater to change the resistance value to correspond to a NAND truth table. For example, once the PCM film component is initialized to render the PCM film component to a fully crystalline state, the PCM film component may be configured to produce an output voltage, as measured between the first end contact and the second end contact to correspond to a NAND logic truth table.

In another embodiment, the method may include initializing the PCM film component by simultaneously applying a first combination of reset pulses to the first proximity heater and to the second proximity heater.

In an embodiment, responsive to initializing the PCM film component with reset pulses, the method may include programming the PCM film component by simultaneously applying a first combination of set pulses to the first proximity heater and to the second proximity heater to change the resistance value to correspond to a NOR truth table. For example, once the PCM film component is initialized with reset pulses to render the PCM film component to a majority amorphous state, the PCM film component may be configured to produce an output voltage to correspond to a NOR logic truth table when the order of a load resistor and PCM film component are swapped.

In an embodiment, the method may include forming the PCM film component as a fin between the first end contact and the second end contact. Further, the method may include forming the first proximity heater as a first side gate of the PCM film component and forming the second proximity heater as a second gate of the PCM film component.

In an embodiment, the PCM film component may include a composition selected from a group consisting of $Ge_2Sb_2Te_5$, GeTe, and $Sb_2Te_3$.

In an embodiment, the first proximity heater may be at least partially overlapping the second proximity heater, or the second proximity heater may be at least partially overlapping the first proximity heater, the overlapping configured to modulate conductance between the first end contact and the second end contact. For example, the first proximity heater and the second proximity heaters may be at least partially overlapping each other to ensure sufficient heating coverage throughout the PCM film component or to sufficiently heat the PCM film component throughout at least one length of its material volume between the first proximity heater and the second proximity heater. In other words, the overlapping proximity heaters will not allow any portion of the PCM film component to not be heated once the proximity heaters are energized.

The present application will now be described in greater detail by referring to the following detailed description and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, to provide an understanding of the various embodiments of the present application. However, it will be appreciated by one of ordinary skill in the art that the various embodiments of the present application may be practiced without these specific details. In other instances, well-known structures or processing steps have not been described in detail to avoid obscuring the present application.

It will be understood that when an element as a layer, region, or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The embodiments provided herein describe a nonvolatile phase change material (PCM) device to be used as a logic gate, and when the nonvolatile PCM device includes a plurality of terminals, it can be implemented to be used as a NAND logic gate. In an embodiment, the nonvolatile PCM device may include a PCM film component that is contacted on both ends by electrical terminals (i.e., $V_{DD}$ and $V_{out}$) and proximity heaters (i.e., h1 and h2) are formed on opposing sides of the PCM film. In an embodiment, the proximity heaters are electrically isolated from each other and are at least partially overlapping each other within a common plane with the PCM film therebetween. In other words, the proximity heaters may be electrically insulated from each other and from the PCM film component such that no electricity conducting through a first proximity heater will conduct to a second proximity heater through the body of the first proximity heater. The same goes for the PCM film component, wherein no electricity conducting through either of the proximity heaters will conduct to the PCM film component.

In an embodiment, the nonvolatile PCM device may begin in a state corresponding to a fully crystalline state, wherein the PCM film is fully crystalline (c-PCM). Further, when zero voltage pulses (e.g., h1=0, h2=0) are applied to terminals connected to proximity heaters h1 and h2, no change takes place in the PCM film. Therefore, a resistance value between the first end contact $V_{DD}$ and the second end contact $V_{out}$ would be low.

In an embodiment, when the terminal connected to h1 is pulsed with a reset pulse, but the terminal connected to h2 is pulsed with a zero-voltage pulse (e.g., h1=1 and h2=0), an amorphous region will form in the PCM film adjacent to heater h1. The reset pulse intensity, or time duration, is designed to form an amorphous region which extends more than half of the PCM film thickness. The resistance between end contacts $V_{DD}$ and $V_{out}$ remains low even though some of the material was converted to amorphous PCM. The total resistance path is dominated ("almost shorted") by the remaining crystalline PCM low resistance.

In an embodiment, when both proximity heater terminals connected to h1 and h2 are pulsed with a reset pulse (h1=1 and h2=1), the amorphous regions (e.g., halfmoon portion in FIG. 1) extending from each proximity heater h1 and h2 and towards the center of the PCM film merge, the current path between end contacts $V_{DD}$ and $V_{out}$ becomes highly resistive.

In an embodiment, a truth table (e.g., see 100B of FIG. 1) for the four possible pulsing combinations of terminals connected to h1 and h2 are as follows: (h1=0, 0, 1, 1; h2=0, 1, 0, 1; $V_{out}$=1, 1, 1, 0), wherein the truth table for the four possible pulsing combinations implements a NAND logic gate. The NAND logic gate described herein is non-volatile and the PCM device output voltage $V_{out}$ is memorized in the state of the PCM film even after the pulses to the terminals connected to h1 and h2 are removed.

In an embodiment, to set the PCM device to a state that is fully crystalline, a set pulse may be applied to both terminals connected to h1 and h2. Further, it should be noted that if the PCM device was initially reset (i.e., with h1=1 and h2=1) with amorphous regions extending from h1 and h2 through the volume of PCM film, then programming or using the PCM device with set pulses rather that reset pulses will implement a NOR gate.

In an embodiment, other geometries can be used to implement the PCM device. For example, the PCM film can be made in the form of a fin (e.g., like a FinFET) and the proximity heaters are implemented like side gates (not connected).

Further, the proximity heaters can be energized with other sources of energy not limited to electrical terminals. For example, the proximity heaters may be energized using electromagnetic fields or waves such that the proximity heaters are provisioned to deliver heat to the PCM film identical to when energized via the electrical terminals. Other sources of energy may be applied to proximity heaters so long as heat is applied to the PCM film as described herein.

In other embodiments, other heating sources may be used in lieu of the proximity heaters to provide thermal energy to the PCM film similar to the thermal energy provided by the proximity heaters. For example, an open flame via a blow torch or Bunsen burner may be used in lieu of or in addition to the proximity heaters to apply thermal energy to the PCM film so long as the PCM film is heated in a way that is similar to the way the proximity heaters heat the PCM film as described herein.

The present invention will now be described in detail with reference to the Figures.

Figure 1:
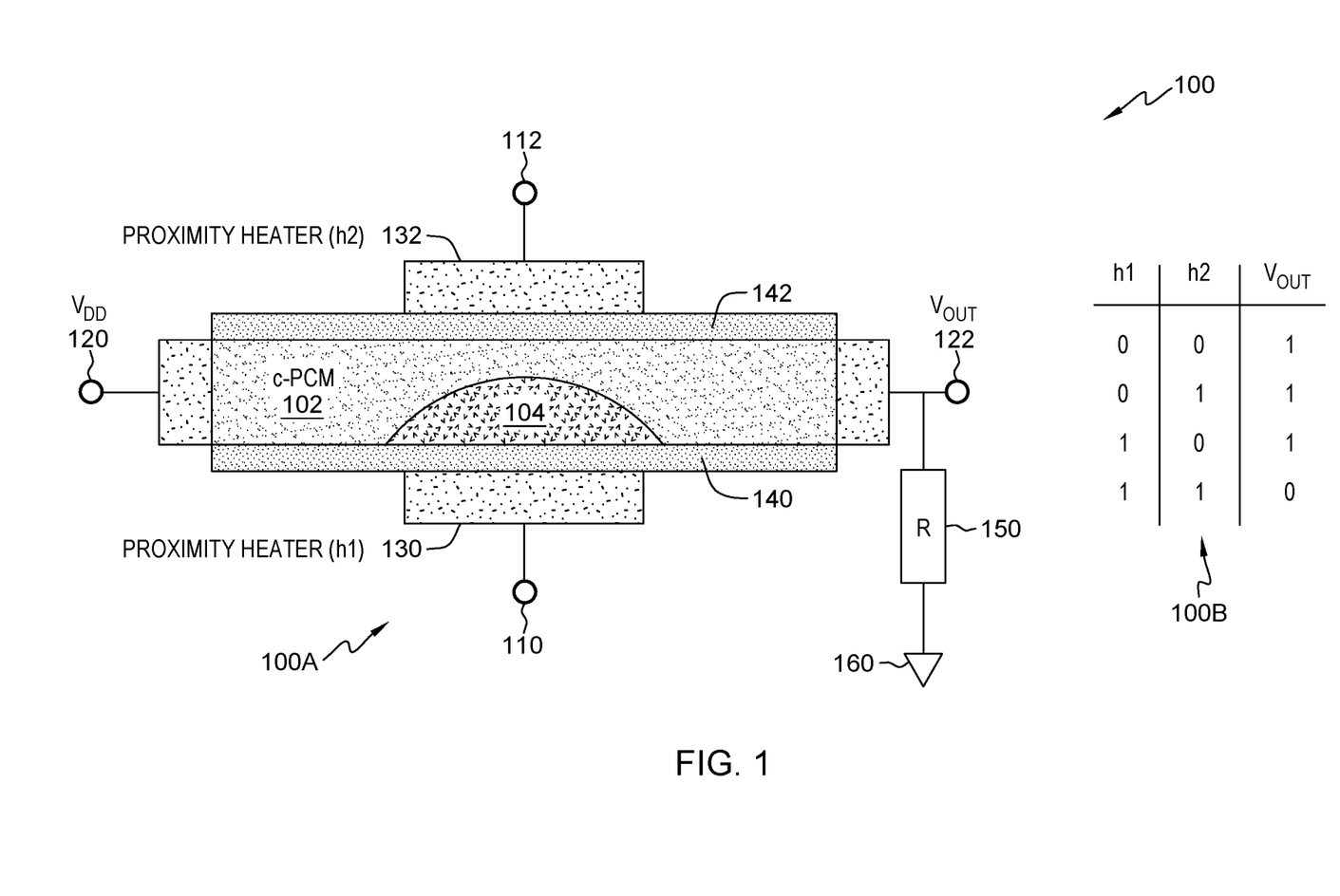
FIG. 1 is an example diagram illustrating a cross-sectional side view of a nonvolatile PCM logic device and corresponding truth table, according to an example embodiment of the present invention.

FIG. 1 illustrates a cross-sectional side view of a nonvolatile PCM logic device diagram 100 of the present application, according to an example embodiment of the present invention.

In an embodiment, diagram 100 includes nonvolatile PCM device 100A and its corresponding logic truth table 100B. In an embodiment, PCM logic device 100A includes PCM film component 102 having a first end contact 120 $V_{DD}$ distally opposed from second end contact 122 $V_{out}$. Further, PCM logic device 100A may include first proximity heater 130 h1 and a second proximity heater 132 h2 posited on opposing faces of PCM film component 102. Proximity heaters (e.g., first proximity heater 130 and second proximity heater 132) are operated or energized by applying voltage or current to first terminal 110 and second terminal 112 respectively.

In an embodiment, first proximity heater 130 and second proximity heater 132 may be electrically isolated from PCM film 102. Proximity heaters (e.g., first proximity heater 130 and second proximity heater 132) are activated by applying programing pulses (e.g., reset or set pulses) to first terminal 110 and second terminal 112 respectively. Applying a combination of pulses to one or more of first terminal 110 and second terminal 112 of the proximity heaters changes a resistance value of PCM film component 102 between first end contact 120 $V_{DD}$ and second end contact 122 $V_{OUT}$, wherein the resistance value produces output voltage corresponding to logic truth table 100B. In an embodiment, logic truth table 100B corresponds to four possible reset pulsing combinations that may be applied to proximity heaters (e.g., first proximity heater 130 and second proximity heater 132). In an embodiment, logic truth table 100B for the four possible reset pulse combinations is implementing a NAND logic gate function. The NAND logic gate described herein is non-volatile and the PCM device output voltage $V_{OUT}$ is stored in the states of the PCM film even after the pulses applied to first terminal 110 and second terminal 112 are removed. Before pulses are applied to first terminal 110 (to energize first proximity heater 130) and second terminal 112 (to energize second proximity heater 132), PCM logic device 100A may be set or initialized by applying a set pulse to first terminal 110 (to energize first proximity heater 130) and second terminal 112 (to energize second proximity heater 132).

In an embodiment, to set PCM logic device 100A to a state that is fully crystalline, a set pulse may be applied to both first proximity heater 130 h1 and second proximity heater 132 h2. Further, it should be noted that if PCM logic device 100A was initially reset (i.e., with h1=1 and h2=1), then using or programming PCM logic device 100A with set pulses rather that reset pulses will implement a NOR gate, when the order of resistor 150 R and PCM film component 102 are swapped (i.e., resistor terminal 160 is connected to $V_{DD}$ and terminal used for first end contact 120 is connected to ground).

The method of forming PCM logic device 100A may include positing PCM film component 102 between first proximity heater 130 and second proximity heater 132. In an embodiment, PCM film component 102 may be positioned directly adjacent to first proximity heater 130 such that heat generated from the proximity heater will change the temperature of PCM film component 102.

The method of forming PCM logic device 100A may further include providing an energizing component (e.g., to heat PCM film component 102 to change a resistance value of PCM film component 102). The energizing component may include first proximity heater 130 or second proximity heater 132, which when energized are configured to apply heat to PCM film component 102. The energizing component may be a resistive element in direct contact with PCM film component 102, which when energized is configured to apply heat to PCM film component 102. Other energizing components may be used so long as it is configured to heat the PCM film component sufficient to change a state of PCM film component 102 to the intended setting.

In an embodiment, PCM logic device 100A may include PCM film component 102 that is in an amorphous phase, wherein PCM film component 102 is a highly resistive material that resembles a dielectric material. Heat may be applied to PCM film component 102 to change the phase from a completely amorphous phase to a mix of amorphous and crystalline and ultimately to a crystalline phase, wherein PCM film component 102 is a highly conductive material that is semi-metallic.

In an embodiment, PCM logic device 100A may be tuned (i.e., heated to change the properties of PCM film component 102) by various methods. In one embodiment, a melt quench method may be provided where a high current pulse with an abrupt trailing edge (e.g., reset pulse) is applied to first proximity heater 130, which when applied is configured to generate enough heat in PCM film component 102 such that a halfmoon shaped portion (e.g., amorphous PCM region 104) of PCM film component 102 will melt. As the trailing edge dissipates, PCM film component 102 is quickly cooled or returned to ambient temperature, so that there is little to no opportunity for PCM film component 102 to be crystallized and it remains in the amorphous phase. In another embodiment, an annealing method may be provided where a pulse (e.g., set) is applied to first proximity heater 130, that then heats PCM film component 102 to a temperature that is not sufficient to cause PCM film component 102 to melt, but the temperature exceeds the crystallization temperature. The amorphous PCM region 104 will begin nucleating crystals and may fully crystallize.

In an embodiment, PCM film component 102 may be composed of germanium-antimony-telluride ($Ge_2Sb_2Te_5$), whose crystallization temperature is about 160-170 degrees Celsius (C), and whose melting temperature may be approximately 600-700 degrees C. PCM film component 102 of this composition can be crystallized with a current pulse applied to the proximity heater that allows the PCM film component 102 to reach the crystallization temperature. For example, for PCM crystallization, the PCM film component 102 does not need to be melted, rather just enough heat may be applied so that the PCM film component 102 temperature may be sufficient to achieve crystallization.

In an embodiment, truth table 100B for nonvolatile PCM logic device 100A may be provided to illustrate the relationship between first proximity heater 130 h1 and second proximity heater 132 h2 and their corresponding terminal inputs and the resistance value of PCM film component 102 of PCM logic device 100A. For example, as the phase of PCM film component 102 transitions from 0% crystallinity (e.g., amorphous PCM, or α-PCM) to 100% crystallinity (e.g., crystalline PCM, or c-PCM), the resistance of PCM logic device 100A transitions from most resistive to least resistive. Thus, PCM logic device 100A may be tuned to a specific resistive value by changing the crystallinity of PCM film component 102.

First proximity heater 130 and second proximity heater 132 may be composed of an electrically resistive metal or metal alloy, or a doped semiconductor material. Examples of electrically resistive materials that may be used in the present application include titanium nitride (TiN), and Tantalum Nitride (TaN), n-type or p-type poly-Si.

In an embodiment, first proximity heater 130 and second proximity heater 132 are electrically isolated from PCM film 102. First proximity heater 130 and second proximity heater 132 may also be thermally coupled to PCM film 102 using a thermal conductor (e.g., first thermal conductor 140 and second thermal conductor 142). In an embodiment, example materials that are both thermal conductors and electrical isolators are boron nitride (BN) and aluminum nitride (AlN). The thermal conductivity of AlN can be up to 321 W/(m·K). Further, hexagonal and crystalline boron nitride have a thermal conductivity in the range of 600 to 740 W/(m·K).

First proximity heater 130 may be composed of a resistive material such as, for example, TaN, TiN, Ruthenium Nitride (RuN), Ruthenium Tantalum Nitride (RuTaN), Cobalt Tungsten Phosphorous (CoWP), Cobalt Nitride (CoN), Tungsten Nitride (WN) or any combination thereof. First proximity heater 130 may have a thickness from 2 nm to 100 nm; other thicknesses are possible and can be used in the present application as the thickness of first proximity heater 130. First proximity heater 130 may be formed by a deposition process such as, for example, evaporation, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing), or a patterning process (such as, for example, lithography and etching) may follow the deposition of the conductive material that provides first proximity heater 130.

Second proximity heater 132 may be composed of one of the conductive materials mentioned above for first proximity heater 130. In one embodiment, the conductive material that provides second proximity heater 132 is compositionally different from first proximity heater 130. In another embodiment, the conductive material that provides second proximity heater 132 is compositionally the same as the first proximity heater 130. Second proximity heater 132 can have a thickness within the thickness range mentioned above for first proximity heater 130. Second proximity heater 132 may be formed utilizing one of the deposition processes mentioned above in providing first proximity heater 130, followed by performing a patterning process, such as, photolithography and etching.

PCM film component 102 can be formed utilizing a deposition process such as, for example, PECVD, PVD, CVD, or ALD. PCM film component 102 may have a thickness from 3 nm to 50 nm. Other thicknesses are possible and can be employed as the thickness of PCM film component 102. In some embodiments, PCM film component 102 has a conformal thickness. The term "conformal" denotes that a material layer has a vertical thickness along horizontal surfaces that is substantially the same (i.e., within ±5%) as the lateral thickness along vertical surfaces.

In an embodiment, nonvolatile PCM logic device 100A may include load resistor 150 R, wherein the resistance of R depends on the PCM material resistance in the amorphous and crystalline states. When the PCM is crystalline (e.g., h1=0, h2=0, or h1=1, h2=0, or h1=0, h2=1) ideally $V_{OUT}$ should be approximately $V_{DD}$. Since the resistance value of PCM film component 102 and load resistor 150 R are functioning as a voltage divider, load resistor 150 R should be greater than (e.g., by a factor or about 10) the resistance value of PCM film component 102 (i.e., $R_{C\text{-}PCM}$=resistance of the crystalline PCM film component 102). For example, $R > 10 \times R_{C\text{-}PCM}$. When PCM film component 102 is fully amorphous (i.e., h1=1, h2=1), then $V_{OUT}$ should be approximately zero. So, $R_{a\text{-}PCM}$, which is the resistance of the amorphous PCM film component 102, must be much larger than load resistor 150 R. For example, $R_{a\text{-}PCM} > 10 \times R$. Since typically $R_{a\text{-}PCM} \gg R_{C\text{-}PCM}$ the requirement outlined above can be easily satisfied.

Figure 2:
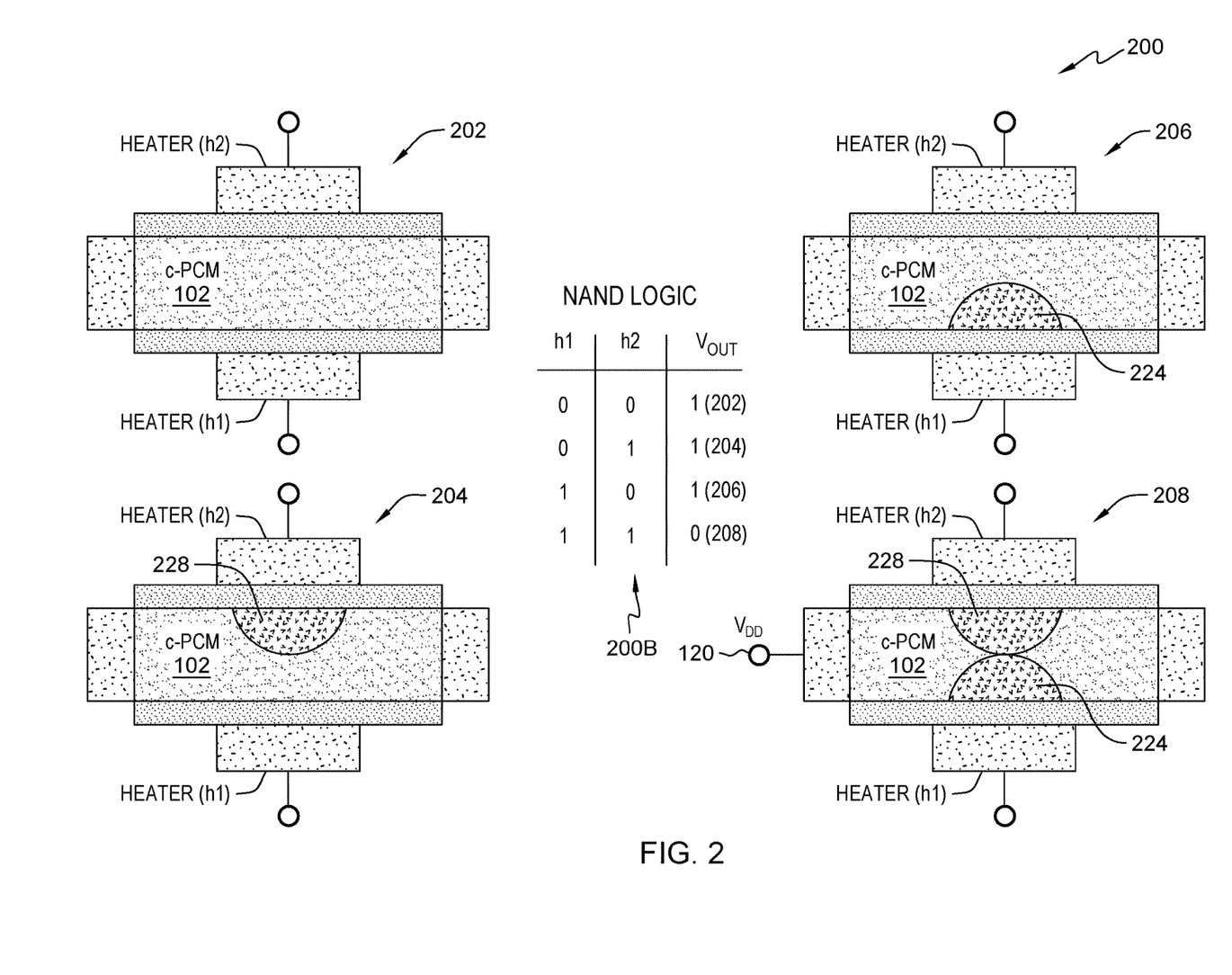
FIG. 2 is an example diagram illustrating nonvolatile PCM logic device states and corresponding truth table, according to an example embodiment of the present invention.

FIG. 2 is a cross-sectional side view of a nonvolatile PCM logic device state diagram 200, according to an example embodiment of the present invention. Diagram 200 illustrates cross-sectional views of four states of change to PCM logic device 100A due to one or more of the proximity heaters being energized to apply heat to PCM film component 102. In an embodiment, as heat is applied to PCM film component 102, the resistance value changes to produce output voltages (i.e., $V_{out}$) according to a logic truth table (e.g., NAND logic truth table 200B). In other words, the logic truth table is merely a tabular representation of PCM logic device 100A.

In an embodiment, PCM logic device 100A may be in a first state 202, which is a state achieved after a set pulse is applied to h1 and h2. Considering reset pulses, as described in NAND logic truth table 200B, when no heat is applied to PCM film component 102 (i.e., h1=0, h2=0) the resulting in no change to PCM film component 102. For example, if h1 and h2 are not energized, then no heat is applied to PCM film component 102 resulting in an output voltage (e.g., $V_{OUT}$) representing a logical 1. For example, considering the circuit shown in FIG. 1, where $V_{DD}$ is connected to the input voltage terminal (e.g., first end contact 120 $V_{DD}$), then an output of logical 1 in output voltage terminal (e.g., second end contact 122 $V_{OUT}$), will be $V_{OUT} \sim V_{DD}$ (i.e., output voltage is closed to $V_{DD}$).

In an embodiment, PCM logic device 100A may be in a second state 206 wherein first proximity heater h1 is energized and heat is applied to PCM film component 102, resulting in a change to PCM film component 102 corresponding to a first halfmoon portion (e.g., first amorphous PCM region 224) originating from a surface of PCM film component 102 that is adjacent to first proximity heater h1. For example, if h1 is energized and h2 is not energized, then heat is applied to a surface of PCM film component 102 that is adjacent to first proximity heater, resulting in the first halfmoon portion (e.g., amorphous PCM region 224). Further, no heat is applied to a surface of PCM film component 102 that is adjacent to second proximity heater h2, resulting in an output voltage (e.g., $V_{OUT}$) representing a logical 1.

In an embodiment, PCM logic device 100A may be in a third state 204 wherein second proximity heater h2 is energized and heat is applied to PCM film component 102, resulting in a change to PCM film component 102 corresponding to a second halfmoon portion (e.g., second amorphous PCM region 228) originating from a surface of PCM film component 102 that is adjacent to second proximity heater h2. For example, if h2 is energized and h1 is not energized, then heat is applied to a surface of PCM film component 102 that is adjacent to second proximity heater h2, resulting in the second halfmoon portion (e.g., amorphous PCM region 224). Further, no heat is applied to a surface of PCM film component 102 that is adjacent to first proximity heater h1, resulting in an output voltage (e.g., $V_{OUT}$) representing a logical 1.

In an embodiment, PCM logic device 100A may be in a fourth state 208 wherein first proximity heater h1 is energized and second proximity heater h2 is energized, thereby applying heat to PCM film component 102, resulting in changes to PCM film component 102 corresponding to a first halfmoon portion (e.g., first amorphous PCM region 224) originating from a first surface of PCM film component 102 that is adjacent to first proximity heater h1 and a second halfmoon portion (e.g., second amorphous PCM region 228) originating from a second surface of PCM film component 102 that is adjacent to second proximity heater h2. For example, if h1 is energized and h2 is energized, then heat is applied to a surface of PCM film component 102 that is adjacent to first proximity heater 130 and heat is applied to a surface of PCM film component 102 that is adjacent to second proximity heater 132, resulting in the opposing halfmoon portions. As first amorphous region 224 and second amorphous region 228 merge, the current path between the input voltage terminal (e.g., first end contact 120 $V_{DD}$) and output voltage terminal (e.g., second end contact 122 $V_{OUT}$) is interrupted by the high resistance amorphous material. This results in an output voltage (e.g., $V_{OUT}$) representing a logical 0. For example, considering the circuit shown in FIG. 1, where $V_{DD}$ is connected to first end contact 120 $V_{DD}$, then an output of logical 0 in second end contact 122 $V_{OUT}$, will be Vout~0V (i.e., output voltage is close to zero volts).

Figure 3A:
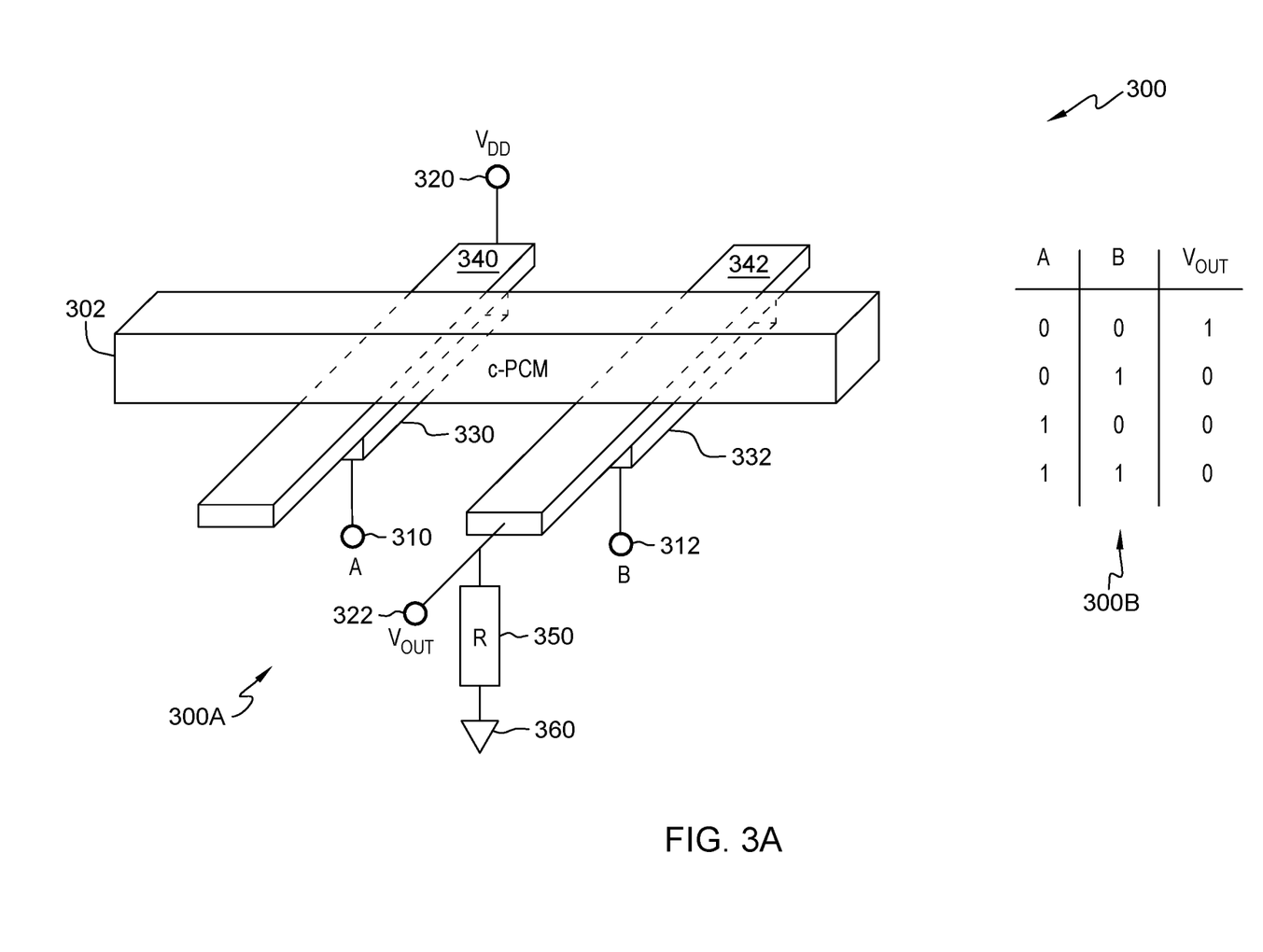
FIG. 3A is an example diagram illustrating a perspective view of a planar nonvolatile PCM logic device and its truth table, according to an example embodiment of the present invention.

FIG. 3A is an example diagram 300 illustrating a perspective view of a planar nonvolatile PCM logic device and its truth table, according to an example embodiment of the present invention.

In an embodiment, diagram 300 includes planar nonvolatile PCM logic device 300A and its corresponding logic truth table (e.g., NOR truth table 300B). Planar nonvolatile PCM logic device 300A is illustrated having PCM bar component 302 (e.g., multi-facet PCM rod in a crystalline state) horizontally placed on top surfaces of two planar conductors (e.g., first planar conductor 340, second planar conductor 342) having bottom surfaces adjacent to top surfaces of two heating elements (e.g., first heating element 330, second heating element 332) in a distally opposed parallel alignment with each other, the two heating elements positioned perpendicular to PCM bar component 302. First planar conductor 340 may include a first end contact distally opposed from a second end contact, wherein one of the first end contact and the second end contact may be configured to connect to direct voltage terminal 320 (i.e., $V_{DD}$). Second planar conductor 342 include a first end contact distally opposed from a second end contact, wherein one of the first end contact and the second end contact may be configured to connect to output voltage terminal 322 (i.e., $V_{OUT}$) at a first end. It should be noted that the two planar conductors are not required to be of a planar shape or form. The planar conductors may be any shape of conductor sufficient to allow surface contact or proximity to one or more of PCM bar component 302 and either one of first heating element 330 or second heating element 332.

In an embodiment, first heating element 330 may be configured to connect to first heating element terminal 310A at one of a first end contact distally opposed from a second end contact of first heating element 330. Further, first heating element terminal 310A is electrically isolated from first planar conductor 340.

In an embodiment, second heating element 332 may be configured to connect to second heating element terminal 312 B at one of a first end contact distally opposed from a second end contact of second heating element 332. Further, second heating element terminal 312 B is electrically isolated from second planar conductor 342.

In an embodiment, planar nonvolatile PCM logic device 300A may include load resistor 350 R connected to voltage output terminal 322 at a first end and connected to load resistor ground terminal 360 at a second end.

In an embodiment, the resistance of R may depend on the PCM material (e.g., PCM bar component 302) resistance in the amorphous and crystalline states. When PCM bar component 302 is crystalline (e.g., A=0, B=0), ideally $V_{OUT}$ should be approximately $V_{DD}$ (logical 1). Since the resistance value of PCM bar component 302 and load resistor 350 R are functioning as a voltage divider, load resistor 350 R should be much larger than the resistance value of PCM bar component 302, as described above herein. Furthermore, for planar nonvolatile PCM logic device 300A being implemented as a NOR logic device, the only case where the contacts between PCM bar component 302 and both first planar conductor 340 and second planar conductor 340 is not blocked by amorphous region 380 is when first proximity heater 330 and second proximity heater 332 are not programmed with a reset pulse (i.e., A=0, B=0).

In an embodiment, first planar conductor 340 may be electrically isolated from second planar conductor 342 by applying a combination of pulses to one or more of first heating element terminal 310A and second heating element terminal 312 B. For example, when a reset pulse is applied to second heating element 332 via second heating element terminal 312 B, an amorphous region may form in the PCM bar component 302, effectively blocking the contact between PCM bar component 302 and second planar conductor 342. Applying a reset pulse to first heating element terminal 310A may be used to block its contact with PCM bar component 302. Applying reset pulses to either terminals block the contact with the respective conductor. Thus, the application of SET or RESET pulses to first heating element terminal 310A and/or second heating element terminal 312 B are used to control if PCM bar component 302 forms an electrical bridge which electrically connects or disconnects first planar conductor 340 and second planar conductor 342. Following an initialization with SET pulses to first heating element terminal 310A and second heating element terminal 312 B, further application of RESET pulses to first heating element terminal 310A and second heating element terminal 312 B as indicated in truth table 300B implements a logic NOR gate function.

In an embodiment, PCM bar component 302 may be programmed by simultaneously applying a first combination of reset pulses to first heating element 330 and to second heating element 332 to change the resistance value to produce output voltage (e.g., output voltage terminal 322 $V_{OUT}$) corresponding to NOR truth table 300B. Further, applying a first combination of set pulses to first heating element 330 and to second heating element 332 may be configured to initialize PCM bar component 302 to a crystalline state such that PCM bar component 302 electrically connects first planar conductor 340 and second planar conductor 342.

Figure 3B:
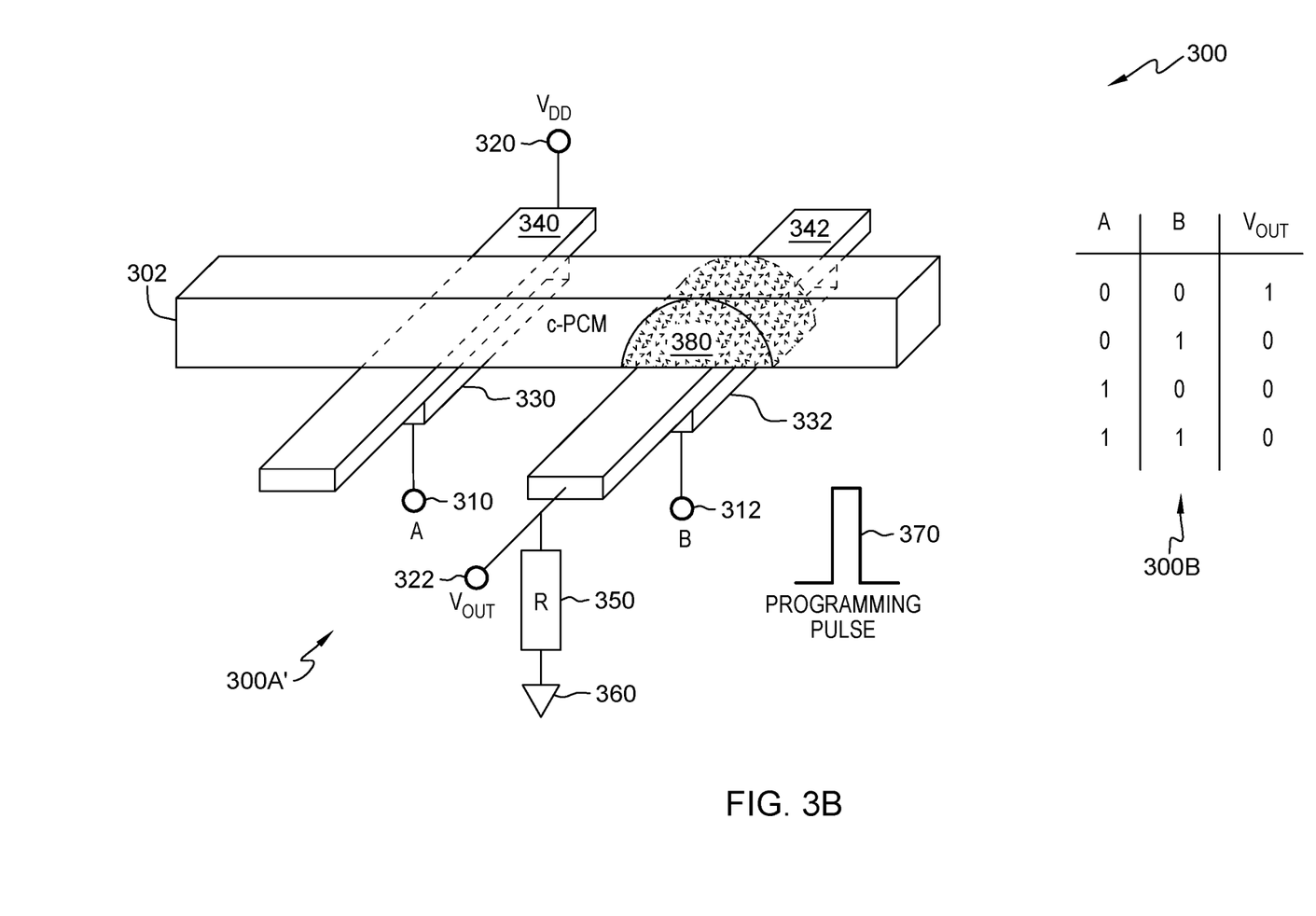
FIG. 3B is an example diagram illustrating a perspective view of a programmed planar nonvolatile PCM logic device and its truth table, according to an example embodiment of the present invention.

FIG. 3B is an example diagram 300 illustrating a perspective view of a programmed planar nonvolatile PCM logic device 300A' and its truth table 300B, according to an example embodiment of the present invention. Shown here, PCM bar component 302 is providing a bridging electrical connection between, or simply bridging, first planar conductor 340 and second planar conductor 342. In other words, PCM bar component 302 electrically connects first planar conductor 340 and second planar conductor 342.

In an embodiment, initially, PCM bar component 302, in the fully crystalline state, may be programmed by providing a reset pulse (e.g., programming pulse 370) to one or more of first heating element 330 and second heating element 332 (e.g., as shown, programming pulse 370 is applied to second heating element terminal 312 B) to energize the pulsed heating element (e.g., second heating element 332) to produce amorphous region 380 in a section or portion of PCM bar component 302 in contact with the pulsed heating element. As shown in this embodiment, amorphous region is formed beginning from a bottom surface of PCM bar component 302 and forms upward and away from the bottom surface. The amorphous region covers the contact area between the PCM bar component 302 and second planar conductor 342, thereby blocking conductivity between first planar conductor 340 and second planar conductor 342. Regardless of which heating element is energized, one or more of the heating elements being energized will result in a blockage of conductivity between first planar conductor 340 and second planar conductor 342 and only a fully crystalline PCM bar component 302 will permit electrical conductivity between first planar conductor 340 and second planar conductor 342. Furthermore, voltage measured at the output voltage terminal 322 (i.e., $V_{OUT}$) will correspond to logic truth table 300B as a result of programming (i.e., providing programming pulse 370 to one or more of first heating element terminal 310A and second heating element terminal 312 B) one or more of first heating element 330 and second heating element 332.

Figure 3C:
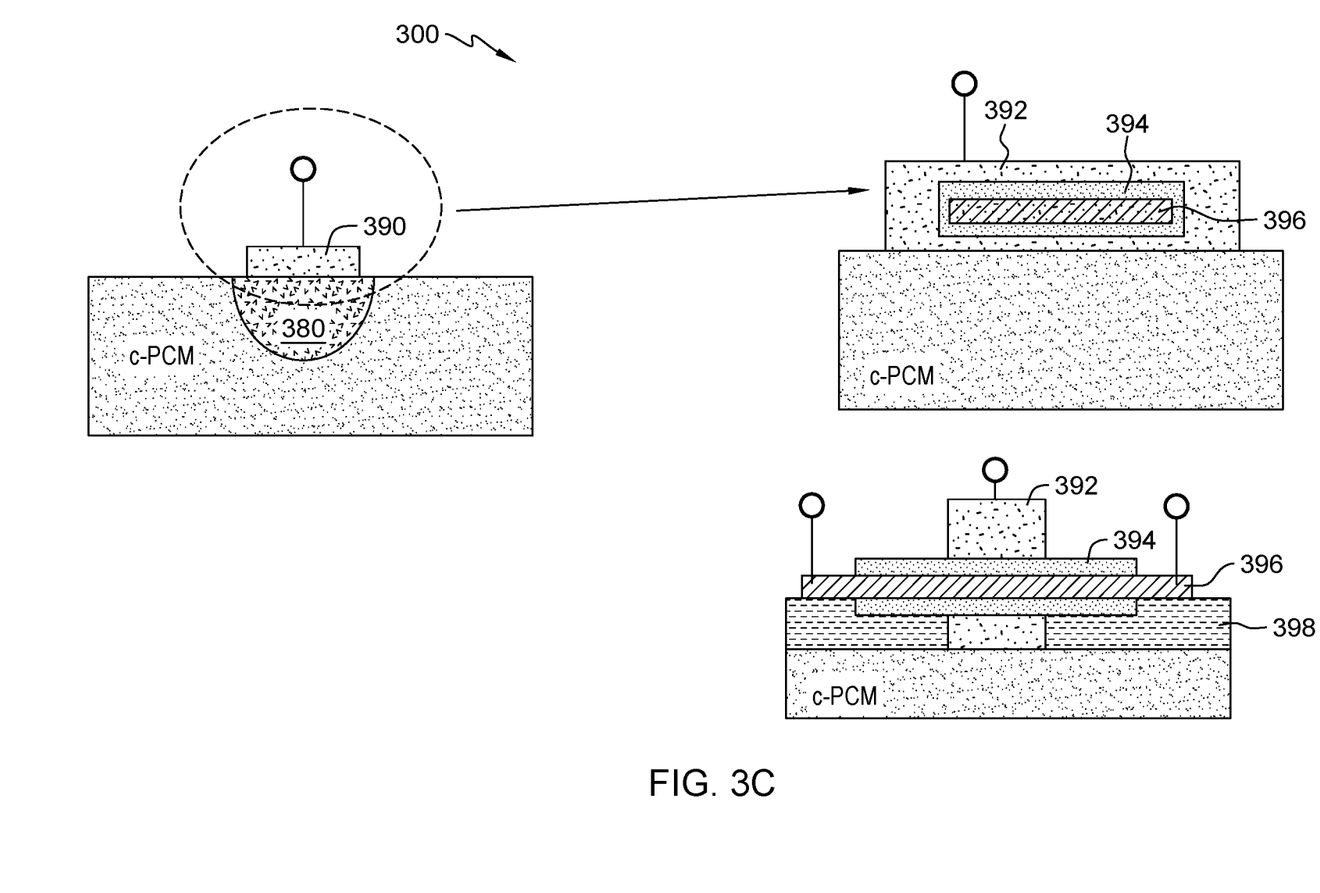
FIG. 3C illustrates cross-sectional views of a proximity heater used with a planar nonvolatile PCM logic device, according to an example embodiment of the present invention.

FIG. 3C illustrates cross-sectional views of proximity heater 390 used with planar nonvolatile PCM logic device 300A, according to an example embodiment of the present invention.

In an embodiment, proximity heater 390 may include an outer casing 392 composed of a metallic conductor material (e.g., Tungsten (W)) configured to make contact or be placed adjacent to PCM material (e.g., PCM film component 102, PCM bar component 302). Further, proximity heater 390 may include thermal conductor 394 composed of a thermal conductor and electrical insulator material (e.g., aluminum nitride (AlN), hex-BN) that serves as both an electrical insulator and a thermal conductor, posited within outer casing 392. Further, proximity heater 390 may include resistive heater 396 configured to generate heat when energized. Resistive heater 396 may be composed of a heat generating material (e.g., Tantalum Nitride (TaN), amorphous carbon, typically doped with H) that generates heat when energized. Further, proximity heater 390 may include thermal insulator 398 configured to provide support to resistive heater 396 and configured to insulate the PCM material from resistive heater 396 outside the area in contact with the PCM material. For example, thermal insulator 398 may be composed of a porous dielectric material (e.g., low-k porous dielectric). In an embodiment, thermal insulator 398 may not be needed as part of the configuration of proximity heater 390 and an air gap or any other thermal insulator may be used.

In an embodiment, proximity heater 390 may include one or more terminals configured to receive an electrical connection, which when provided with electrical energy, are configured to energize resistive heater 396 to generate thermal energy radiating away from its body. Further, proximity heater 390 is configured to be implemented with planar nonvolatile PCM logic device 300A to implement a NOR gate, as described herein.

Figure 4:
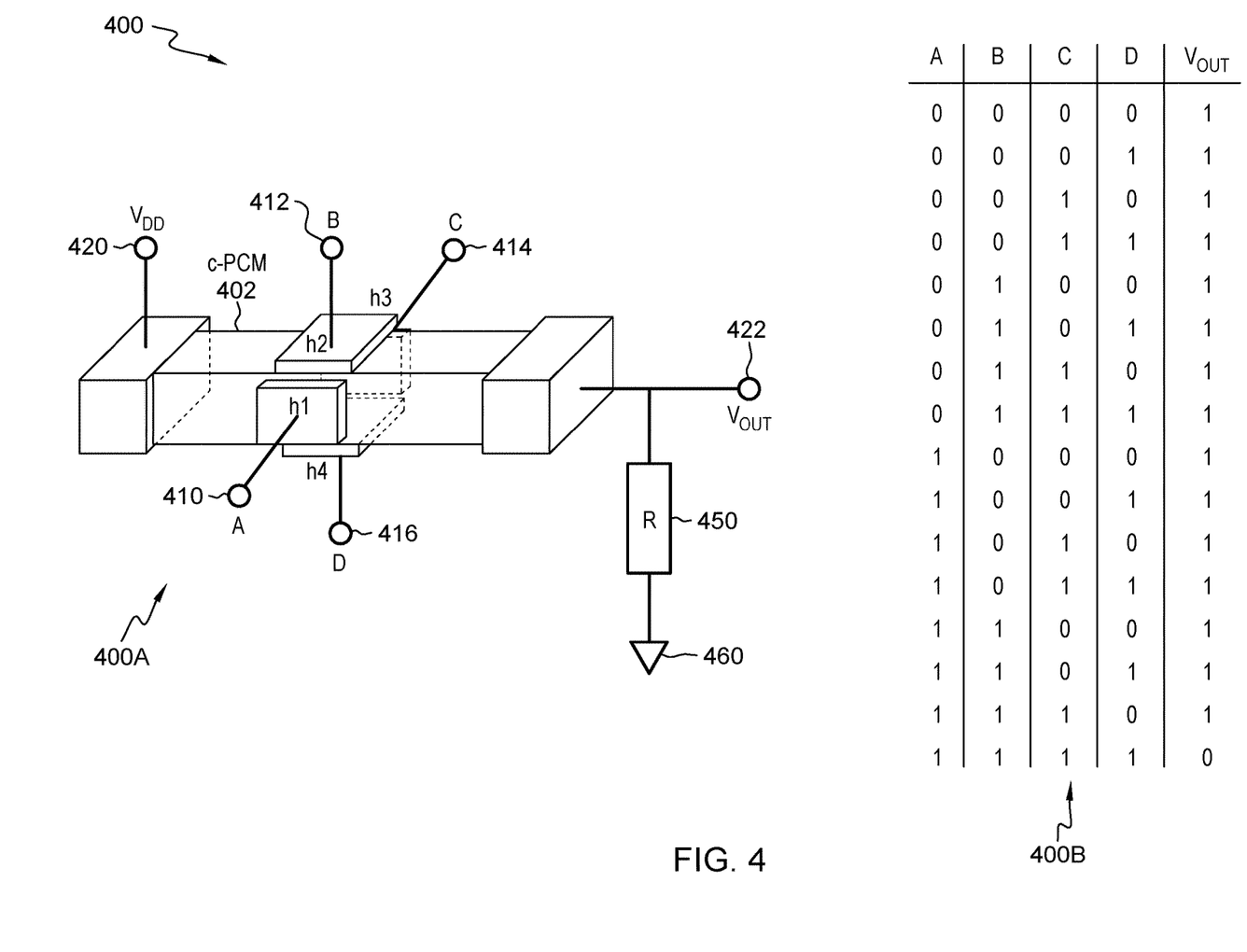
FIG. 4 illustrates a side view a modular nonvolatile PCM logic device, according to an example embodiment of the present invention.

FIG. 4 illustrates an example diagram 400 including a side view of modular nonvolatile PCM logic device 400A and its corresponding logic truth table 400B, according to an example embodiment of the present invention.

In an embodiment, diagram 400 includes modular nonvolatile PCM device 400A and its corresponding logic truth table 400B. In an embodiment, modular PCM logic device 400A includes PCM bar component 402 posited between first end contact 420 $V_{DD}$ distally opposed from second end contact 422 $V_{OUT}$. Further, modular PCM logic device 400A may include one or more proximity (side) heaters (e.g., heater h1, heater h2, . . . , heater hn) placed on each face of PCM bar component 402. The one or more proximity heaters are activated by the corresponding terminals (e.g., first terminal 410A, second terminal 412 B, third terminal 414 C, and fourth terminal 416 D).

In an embodiment, the one or more proximity heaters of modular PCM logic device 400A may be electrically isolated from each of the other proximity heaters and PCM bar component 402, wherein applying a combination of pulses to one or more of the one or more terminals (e.g., first terminal 410A, second terminal 412 B, third terminal 414 C, fourth terminal 416 D) may be configured to change a resistance value of PCM bar component 402 between first end contact 420 $V_{DD}$ and second end contact 422 $V_{OUT}$, wherein the resistance value produces output voltage at second end contact 422 $V_{OUT}$ corresponding to logic truth table 400B. In an embodiment, logic truth table 400B corresponds to sixteen possible pulsing combinations of the heater terminals wherein logic truth table 400B for the sixteen possible pulsing combinations is configured to implement a NAND logic gate. The NAND logic gate described herein is non-volatile and the PCM device output voltage $V_{OUT}$ is memorized in the stated of the PCM film even after the pulses from the one or more terminals are removed.

In an embodiment, to set modular PCM logic device 400A to a state that is fully crystalline, a set pulse may be applied to each of first terminal 410A, second terminal 412 B, third terminal 414 C, and fourth terminal 416 D. Further, it should be noted that if modular PCM logic device 400A was initially reset (i.e., h1=1, h2=1), then using or programming modular PCM logic device 400A with set pulses rather that reset pulses will implement a NOR gate, when the order of load resistor 450 R and PCM bar component 402 are swapped (i.e., ground terminal of load resistor 450 R is connected to first end contact 420 $V_{DD}$ and first end contact 420 is connected to ground). In other words, if modular PCM logic device 400A is initialized by applying set pulses to each of the one or more proximity heaters, resulting in a fully crystalline (e.g., very conductive) PCM bar component 402, then the output voltage measured across first end contact 420 $V_{DD}$ and the ground terminal connected to load resistor 450 R will correspond to a NOR truth table.

In an embodiment, the one or more proximity heaters of modular PCM logic device 400A may be at least partially overlapping to modulate conductance between first end contact 420 $V_{DD}$ and second end contact 422 $V_{OUT}$.

Figure 5:
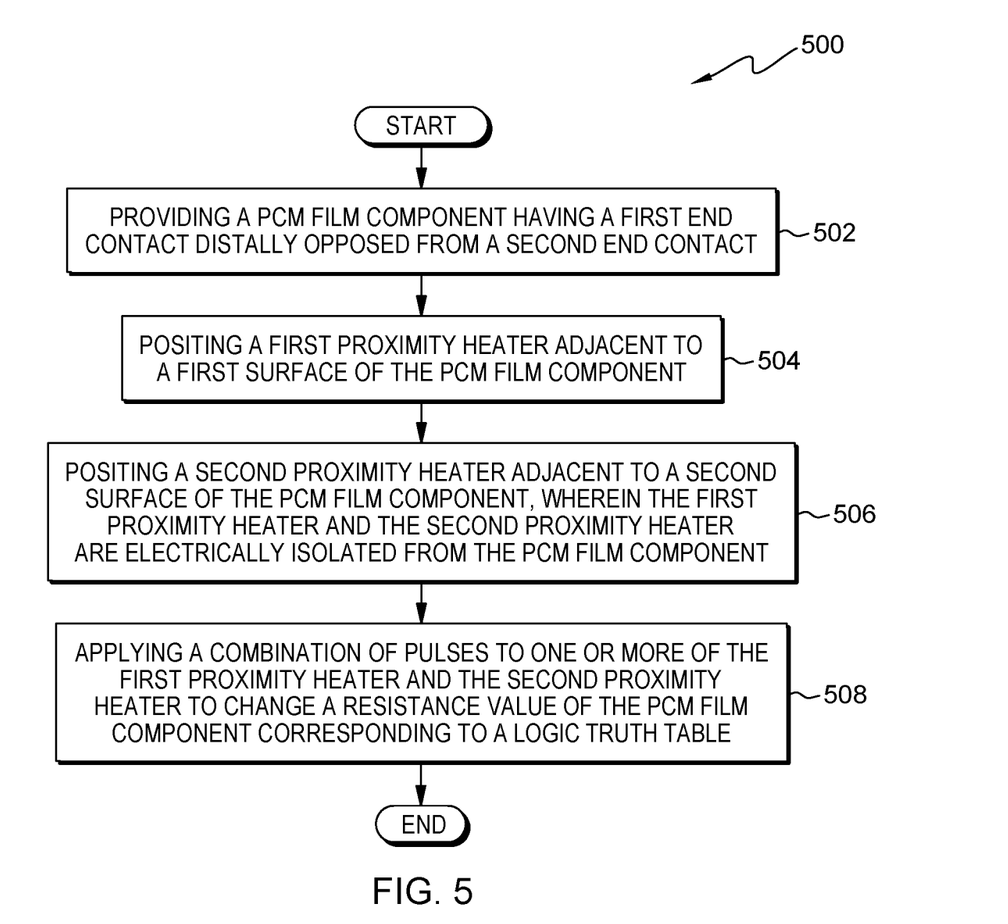
FIG. 5 is a flowchart of a method for forming a nonvolatile PCM logic device, according to an example embodiment of the present invention.

FIG. 5 is a flowchart of a method 500 for forming a nonvolatile PCM logic device 100A, according to an example embodiment of the present invention.

In an embodiment, method 500 may include providing 502 a PCM film component having a first end contact distally opposed from a second end contact.

Method 500 may further include positing 504 a first proximity heater adjacent to a first surface of the PCM film component and positing 506 a second proximity heater adjacent to a second surface of the PCM film component, wherein the first proximity heater and the second proximity heater are electrically isolated from the PCM film component.

Method 500 may further include applying 508 a combination of pulses to one or more of the first proximity heater and the second proximity heater to change a resistance value of the PCM film component corresponding to a logic truth table. For example, one or more processors may be configured for applying 508 the combination of pulses to the proximity heaters, wherein the pulses may be generated by a voltage or power source.

In an embodiment, method 500 may include initializing the PCM film component by simultaneously applying a first combination of set pulses to the first proximity heater and to the second proximity heater. Further, method 500 may include programming the PCM film component by simultaneously applying a first combination of reset pulses to the first proximity heater and to the second proximity heater to change the resistance value to correspond to a NAND truth table.

In an embodiment, method 500 may include initializing the PCM film component by simultaneously applying a first combination of reset pulses to the first proximity heater and to the second proximity heater. Further, method 500 may include programming the PCM film component by simultaneously applying a first combination of set pulses to the first proximity heater and to the second proximity heater to change the resistance value to correspond to a NOR truth table.

In an embodiment, method 500 may include forming the PCM film component as a fin between the first end contact and the second end contact. Further, method 500 may include forming the first proximity heater as a first side gate of the PCM film component and forming the second proximity heater as a second gate of the PCM film component.

In an embodiment, the PCM film component may include a composition of one of $Ge_2Sb_2Te_5$, GeTe, and $Sb_2Te_3$.

In an embodiment, the first proximity heater and the second proximity heater may be at least partially overlapping to modulate conductance between the first end contact and the second end contact.

Figure 6:
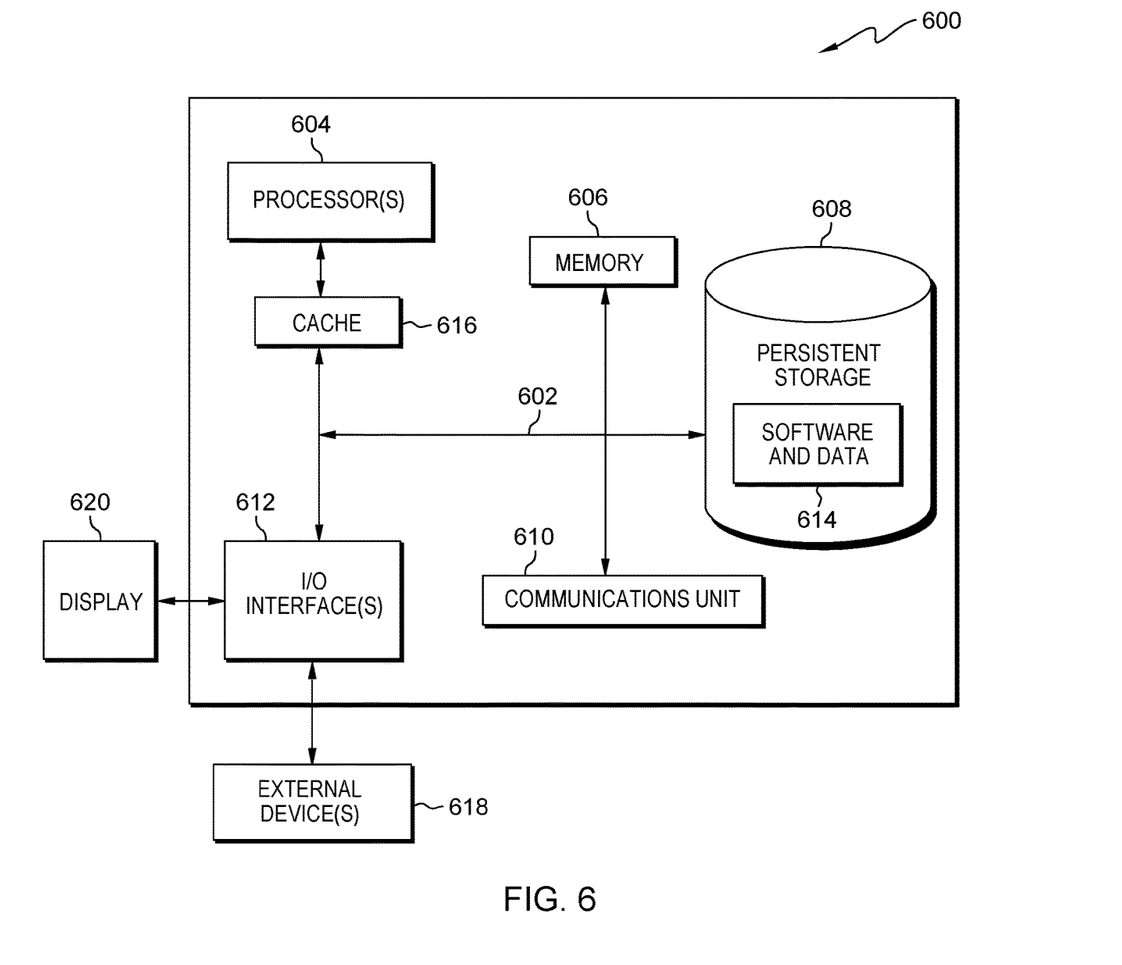
FIG. 6 depicts a block diagram of components of a server computer executing the method for forming a nonvolatile PCM logic device, according to an example embodiment of the present invention.

FIG. 6 depicts a block diagram of components of a server computer executing method 500 for forming a nonvolatile PCM logic device, according to an example embodiment of the present invention. It should be appreciated that FIG. 6 provides only an illustration of one implementation and does not imply any limitations with regard to the environments in which different embodiments can be implemented. Many modifications to the described environment can be made.

Method 500 may be executed on server computer 600 or computing device that includes communications fabric 602, which provides communications between cache 616, memory 606, persistent storage 608, communications unit 610, and input/output (I/O) interface(s) 612. Communications fabric 602 can be implemented with any architecture designed for passing data and/or control information between processors (such as microprocessors, communications and network processors, etc.), system memory, peripheral devices, and any other hardware components within a system. For example, communications fabric 602 can be implemented with one or more buses or a crossbar switch.

Memory 606 and persistent storage 608 are computer readable storage media. In this embodiment, memory 606 includes random access memory (RAM). In general, memory 606 can include any suitable volatile or non-volatile computer readable storage media. Cache 616 is a fast memory that enhances the performance of computer processor(s) 604 by holding recently accessed data, and data near accessed data, from memory 606.

Programs may be stored in persistent storage 608 and in memory 606 for execution and/or access by one or more of the respective computer processors 604 via cache 616. In an embodiment, persistent storage 608 includes a magnetic hard disk drive. Alternatively, or in addition to a magnetic hard disk drive, persistent storage 608 can include a solid-state hard drive, a semiconductor storage device, read-only memory (ROM), erasable programmable read-only memory (EPROM), flash memory, or any other computer readable storage media that is capable of storing program instructions or digital information.

The media used by persistent storage 608 may also be removable. For example, a removable hard drive may be used for persistent storage 608. Other examples include optical and magnetic disks, thumb drives, and smart cards that are inserted into a drive for transfer onto another computer readable storage medium that is also part of persistent storage 608.

Communications unit 610, in these examples, provides for communications with other data processing systems or devices. In these examples, communications unit 610 includes one or more network interface cards. Communications unit 610 may provide communications through the use of either or both physical and wireless communications links. Programs, as described herein, may be downloaded to persistent storage 608 through communications unit 610.

I/O interface(s) 612 allows for input and output of data with other devices that may be connected to a server computer 600 and/or a computing device. For example, I/O interface 612 may provide a connection to external devices 618 such as an image sensor, a keyboard, a keypad, a touch screen, and/or some other suitable input device. External devices 618 can also include portable computer readable storage media such as, for example, thumb drives, portable optical or magnetic disks, and memory cards. Software and data 614 used to practice embodiments of the present invention can be stored on such portable computer readable storage media and can be loaded onto persistent storage 608 via I/O interface(s) 612. I/O interface(s) 612 also connect to display 620.

Display 620 provides a mechanism to display data to a user and may be, for example, a computer monitor.

Software and data 614 described herein is identified based upon the application for which it is implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method comprising:
providing a nonvolatile phase change material (PCM) film component having a first end contact distally opposed from a second end contact;
positing a first proximity heater adjacent to a first surface of the PCM film component:
positing a second proximity heater adjacent to a second surface of the PCM film component, wherein the first proximity heater and the second proximity heater are electrically isolated from the PCM film component; and
applying a combination of pulses to one or more of the first proximity heater and the second proximity heater to change a resistance value of the PCM film component corresponding to a logic truth table.

2. The method of claim 1, further comprising: initializing the PCM film component by: simultaneously applying a first combination of set pulses to the first proximity heater and to the second proximity heater.

3. The method of claim 2, further comprising: programming the PCM film component by:
simultaneously applying a first combination of reset pulses to the first proximity heater and to the second proximity heater to change the resistance value to correspond to a NAND truth table.

4. The method of claim 1, further comprising: initializing the PCM film component by:
simultaneously applying a first combination of reset pulses to the first proximity heater and to the second proximity heater.

5. The method of claim 4, further comprising: programming the PCM film component by:
simultaneously applying a first combination of set pulses to the first proximity heater and to the second proximity heater to change the resistance value to correspond to a NOR truth table.

6. The method of claim 1, further comprising: forming the PCM film component as a fin between the first end contact and the second end contact;
forming the first proximity heater as a first side gate of the PCM film component; and forming the second proximity heater as a second side gate of the PCM film component.

7. The method of claim 1, wherein the PCM film component comprises a composition selected from the group consisting of $Ge_2Sb_2Te_5$, GeTe, and $Sb_2Te_3$.

8. The method of claim 1, wherein the first proximity heater and the second proximity heater are at least partially overlapping.

9. A device comprising:
a phase change material (PCM) film component having a first end contact distally opposed from a second end contact;
a first proximity heater adjacent to a first surface of the PCM film component and electrically isolated from the PCM film component; and
a second proximity heater adjacent to a second surface of the PCM film component and electrically isolated from the PCM film component, wherein a resistance value of the PCM film component corresponding to a logic truth table is changed by applying a combination of pulses to the first proximity heater and the second proximity heater.

10. The device of claim 9, wherein the PCM film component is initialized by simultaneously applying a first combination of set pulses to the first proximity heater and to the second proximity heater.

11. The device of claim 10, wherein the PCM film component is programmed by simultaneously applying a first combination of reset pulses to the first proximity heater and to the second proximity heater to change the resistance value to correspond to a NAND truth table.

12. The device of claim 9, wherein the PCM film component is initialized by simultaneously applying a first combination of reset pulses to the first proximity heater and to the second proximity heater.

13. The device of claim 12, wherein the PCM film component is programmed by simultaneously applying a first combination of set pulses to the first proximity heater and to the second proximity heater to change the resistance value to correspond to a NOR truth table.

14. The device of claim 9, wherein the PCM film component is formed as a fin between the first end contact and the second end contact, wherein the first proximity heater is formed as a first side gate of the PCM film component, and the second proximity heater is formed as a second side gate of the PCM film component.

15. The device of claim 9, wherein the PCM film component comprises a composition selected from a group consisting of $Ge_2Sb_2Te_5$, GeTe, and $Sb_2Te_3$.

16. The device of claim 9, wherein first proximity heater and second proximity heater are at least partially overlapping.

17. A device comprising:
a multi-facet phase change material (PCM) bar component having a plurality of sides and a first end contact distally opposed from a second end contact; and
a plurality of proximity heaters each partially covering one of the plurality of sides of the multi-facet PCM bar component, wherein a resistance value of the multi-facet PCM bar component corresponding to a logic truth table is changed applying a combination of pulses to one or more of the plurality of proximity heaters.

18. The device of claim 17, wherein the multi-facet PCM bar component is initialized by simultaneously applying a first combination of set pulses to the plurality of proximity heaters, then programmed by simultaneously applying a first combination of reset pulses to the plurality of proximity heaters to change the resistance value corresponding to a NAND truth table, wherein each of the plurality of proximity heaters are electrically isolated from the multi-facet PCM bar component.

19. The device of claim 17, wherein the multi-facet PCM bar component is initialized by applying a combination of reset pulses to the plurality of proximity heaters, then programmed by applying a combination of set pulses to the plurality of proximity heaters to change the resistance value corresponding to a NOR truth table, wherein the multi-facet PCM bar component comprises a composition selection from a group consisting of $Ge_2Sb_2Te_5$, GeTe, and $Sb_2Te_3$.

20. The device of claim 17, wherein the plurality of proximity heaters are at least partially overlapping.

* * * * *